United States Patent
Howard et al.

(10) Patent No.: US 10,171,890 B2
(45) Date of Patent: Jan. 1, 2019

(54) SYSTEM AND METHOD FOR BATTERY MANAGEMENT AND ANTENNA ELEVATION IN A PIT MOUNTED AUTOMATIC METER READING UNIT

(71) Applicant: Cooper Technologies Company, Houston, TX (US)

(72) Inventors: Paul Allen Howard, Reston, VA (US); Michael Douglas Manning, Finksburg, MD (US); Jianming Yuan, Boyds, MD (US)

(73) Assignee: Cooper Technologies Company, Houston, TX (US)

( * ) Notice: Subject to any disclaimer, the term of this patent is extended or adjusted under 35 U.S.C. 154(b) by 154 days.

(21) Appl. No.: 15/241,675

(22) Filed: Aug. 19, 2016

(65) Prior Publication Data

US 2018/0054661 A1   Feb. 22, 2018

(51) Int. Cl.
*H05K 5/02* (2006.01)
*H04Q 9/00* (2006.01)

(52) U.S. Cl.
CPC ............. *H04Q 9/00* (2013.01); *H05K 5/0239* (2013.01); *H05K 5/0247* (2013.01); *H04Q 2209/60* (2013.01); *H04Q 2209/88* (2013.01)

(58) Field of Classification Search
CPC .. H04Q 9/00; H04Q 2209/60; H04Q 2209/88; H05K 5/0239; H05K 5/0247; Y02B 90/247; Y04S 20/50; G01D 4/002; G01D 4/006; G01D 4/008; G01R 1/04; H01Q 1/2233
See application file for complete search history.

(56) References Cited

U.S. PATENT DOCUMENTS

| | | | |
|---|---|---|---|
| 4,863,812 A * | 9/1989 | Ueda ................... | H01M 2/1022 429/100 |
| 5,298,894 A | 3/1994 | Cerny et al. | |
| 5,621,419 A | 4/1997 | Meek et al. | |
| 5,825,303 A * | 10/1998 | Bloss, Jr. ................. | H01Q 1/22 340/870.02 |
| 6,218,995 B1 * | 4/2001 | Higgins ................. | G01D 4/002 340/870.02 |

(Continued)

*Primary Examiner* — Nay Tun
(74) *Attorney, Agent, or Firm* — Ziolkowski Patent Solutions Group, SC (57) ABSTRACT

An enclosure and mounting system that provide ideal RF signal transmission and battery management for AMR systems utilized with a utility meter in a utility meter pit environment are disclosed. The AMR device includes processing electronics that receive consumption data from a pit-mounted utility meter, an antenna to wirelessly transmit signals from the AMR device, and an enclosure that houses the processing electronics and the antenna to provide protection thereto. The enclosure is configured to support different battery sizes and provide battery wire/connector management. The enclosure also defines a dome-shaped antenna compartment therein to house the antenna, the antenna compartment protruding out from a remainder of the enclosure so as to provide for positioning of the antenna at a location extended out therefrom. A companion adaptor utilized with the AMR device is mountable to a cover of the utility meter pit and increases a height of the antenna relative thereto.

12 Claims, 5 Drawing Sheets

(56) References Cited

U.S. PATENT DOCUMENTS

| | | | |
|---|---|---|---|
| 6,369,769 B1* | 4/2002 | Nap | G01F 15/063 340/870.02 |
| 6,378,817 B1* | 4/2002 | Bublitz | H01Q 1/04 248/200 |
| 6,414,605 B1 | 7/2002 | Walden et al. | |
| 6,568,645 B2 | 5/2003 | Maddox | |
| 6,617,976 B2 | 9/2003 | Walden et al. | |
| 7,283,063 B2* | 10/2007 | Salser, Jr. | G01D 4/002 340/870.02 |
| 7,444,401 B1 | 10/2008 | Keyghobad et al. | |
| 7,510,422 B2* | 3/2009 | Showcatally | G01D 4/002 340/870.02 |
| 7,554,460 B2* | 6/2009 | Verkleeren | G01D 4/002 340/870.02 |
| 7,746,246 B2* | 6/2010 | Salser, Jr. | G01D 4/002 324/156 |
| 7,752,309 B2 | 7/2010 | Keyghobad et al. | |
| 8,116,071 B2 | 2/2012 | Showcatally | |
| 8,140,667 B2 | 3/2012 | Keyghobad et al. | |
| 8,223,034 B2* | 7/2012 | Bartram | G01D 4/002 340/870.01 |
| 8,378,847 B2* | 2/2013 | Bartram | G01D 4/002 340/870.01 |
| 8,481,626 B1* | 7/2013 | Bhakta | C09D 191/06 438/126 |
| 8,593,792 B2 | 11/2013 | Showcatally | |
| 8,728,568 B2* | 5/2014 | Bhakta | H05K 3/284 427/96.2 |
| 9,912,038 B2* | 3/2018 | Armas | H01Q 21/064 |
| 2002/0063555 A1 | 5/2002 | Maddox | |
| 2004/0202927 A1* | 10/2004 | Drea | H01M 2/1022 429/129 |
| 2005/0018435 A1* | 1/2005 | Selkee | F21L 4/02 362/427 |
| 2008/0074283 A1* | 3/2008 | Verkleeren | G01D 4/002 340/870.02 |
| 2012/0112981 A1* | 5/2012 | Crowther | H01Q 1/2233 343/872 |
| 2013/0082659 A1* | 4/2013 | Kano | H01M 2/105 320/128 |
| 2013/0090006 A1* | 4/2013 | Huynh | H02J 7/0042 439/500 |
| 2013/0272019 A1* | 10/2013 | Engstrom | F21V 21/03 362/581 |
| 2015/0280439 A1* | 10/2015 | Zimmerman | H02J 3/383 307/82 |
| 2016/0028149 A1* | 1/2016 | Armas | H01Q 21/064 343/702 |

* cited by examiner

SYSTEM AND METHOD FOR BATTERY MANAGEMENT AND ANTENNA ELEVATION IN A PIT MOUNTED AUTOMATIC METER READING UNIT

BACKGROUND OF THE INVENTION

Embodiments of the present invention relate generally to enclosures and mounting systems for meters and meter-related devices and, more particularly, to an enclosure and mounting system for mounting an automatic meter reading (AMR) system utilized with a utility meter in a utility meter pit environment, with the enclosure and mounting system enabling ideal RF signal transmission and battery management for the ARM system.

Utility meters, such as water meters, are often located in below-ground pits. This kind of meter-pit installation is commonly used in geographic regions that are not typically subjected to freezing conditions and in which many homes do not have full-slab foundations. In such homes, there is no basement or access space for mounting a water meter indoors.

Automatic Meter Reading (AMR) systems are generally utilized with such utility meters in a utility meter pit environment, with such ARM systems being adapted to allow the communication of meter consumption data without a utility company operator physically visiting the meter to acquire consumption data. The meter located at the bottom of a pit is communicatively coupled to the ARM system, with the ARM system converting consumption data collected by the meter to a signal. The ARM system is communicatively coupled to a utility endpoint to independently communicate the signal in the form of a radio frequency (RF) transmission to a device in the utility endpoint that collects and records consumption data.

It is recognized that meter pit environments may vary significantly and that mounting of an AMR device in meter pits presents a variety of challenges. One challenge of mounting an AMR device is with respect to the positioning of a companion RF transceiver or antenna of the AMR device within the pit for transmission of the consumption data. That is, it is recognized that, for pit mounted utility meters, it is ideal to mount the antenna of the AMR device as high as possible to improve its transmission performance. While the RF transceiver or antenna is usually mounted to the pit lid with an adaptor in an attempt to elevate the antenna, the adaptor cannot be elevated above the lid due to safety and other requirements such as traffic, snow removal, lawn mowing, etc. Thus, existing adaptors typically put the antenna flush with the lid.

Another challenge of mounting an AMR device is with respect to powering the AMR device. RF based AMR systems for water meters are typically powered by batteries, with their battery power consumption being dependent on the installed network and application. Thus, based on the installed network and application, the network/application combination can require different size batteries and/or require regular replacement of the batteries to address battery failure and/or extending product life, in order to reduce maintenance and total system operating cost. The requirement for different size batteries is not easily accommodated by existing AMR system enclosures, as existing enclosures are designed to accommodate only one size of battery therein, such that different enclosures are required for different batteries. With regard to the replacement of the batteries in the AMR system, it is desirable for such replacement of the batteries in the field to be as simple as possible. However, existing enclosures make the battery replacement process complicated and leave battery wires/connectors poorly protected.

Therefore, it would be desirable to provide an enclosure and pit mounting adaptor for an AMR system that provides ideal RF signal transmission and battery management. The pit mounting adaptor would ideally increase the antenna height, with the enclosure supporting different battery sizes and providing battery wire/connector management as an integral part of the enclosure.

BRIEF DESCRIPTION

In accordance with one aspect of the present invention, an AMR system adapted to be mounted in a utility meter pit includes an AMR device having a meter connection configured to provide consumption data from a utility meter in the utility meter pit, processing electronics configured to receive the consumption data via the meter connection and convert the consumption data into a transmittable signal, an antenna configured to wirelessly transmit the transmittable signal to a remote device, and an enclosure that houses the processing electronics and the antenna therein to provide protection thereto from ambient conditions in the utility meter pit. The enclosure defines a dome-shaped antenna compartment therein configured to house the antenna, the antenna compartment protruding out from a remainder of the enclosure so as to provide for positioning of the antenna at a location extended out therefrom.

In accordance with another aspect of the present invention, an AMR system adapted to be mounted in a utility meter pit comprises an AMR device including processing electronics configured to receive consumption data from a utility meter located in the utility meter pit and convert the consumption data into a transmittable signal, an antenna configured to wirelessly transmit the transmittable signal to a remote device, and an enclosure comprising an enclosure body and enclosure cover that collectively define an interior volume that accommodates the processing electronics and the antenna therein. The enclosure body is constructed to define an electronics compartment configured to house the processing electronics therein, an antenna compartment configured to house the antenna therein, and a battery compartment configured to house a battery therein used to power the processing electronics and the antenna. The AMR device also includes a battery and wiring management system configured to secure a battery in place within the battery compartment and manage a positioning and connection of wiring within the enclosure, so as to enable multiple battery form factors in the AMR device and provide for easy replacement of the battery.

In accordance with yet another aspect of the present invention, a method is provided for mounting an AMR device in a utility meter pit having an enclosure and a cover that collectively define a volume within which a utility meter and the AMR device may be positioned. The method includes positioning a cover adaptor onto the cover of the utility meter pit, wherein positioning the cover adaptor comprises translating a projection portion of the cover adaptor through a hole formed in the cover of the utility meter pit, the projection portion comprising a generally hollow interior and mating a flanged end portion of the cover adaptor with the cover of the utility meter pit, the flanged end portion formed on one end of the projection portion. The method also includes inserting a dome-shaped projection of an enclosure of the AMR device into the hollow interior of the projection portion of the cover adaptor to secure the AMR device to the cover adaptor, wherein the dome-shaped projection of the AMR device enclosure mates with the hollow interior of the projection portion to mount an antenna of the AMR device at a height generally flush with a top surface of the cover of the utility meter pit.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Embodiments of the invention are directed to an enclosure and mounting system that provide ideal RF signal transmission and battery management for automatic meter reading (AMR) systems utilized with utility meter in a utility-meter pit environment. The enclosure includes a convex cavity therein and companion adaptor that increases an antenna height. The enclosure also is configured to support different battery sizes and provide battery wire/connector management.

Figure 1:
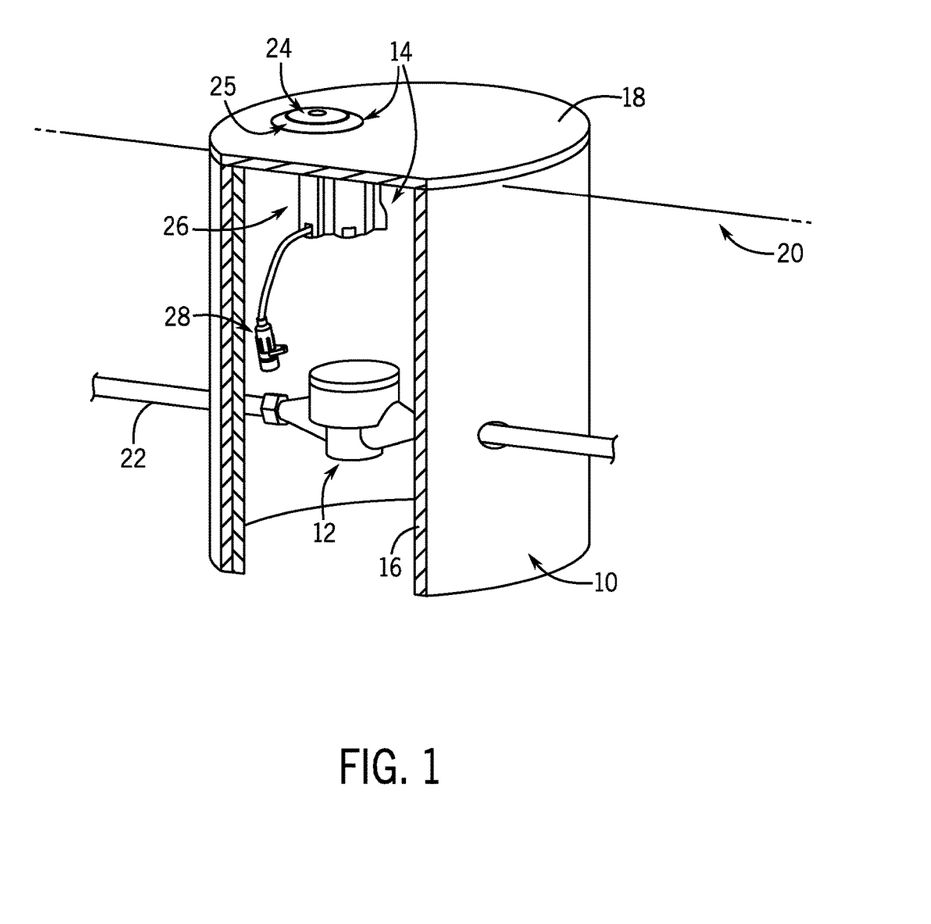
FIG. 1 is a sectioned perspective view of an AMR system implemented in a utility-meter pit environment, according to an embodiment of the invention.

Referring to FIG. 1, a sectional view of an in-ground pit 10 is provided that illustrates positioning therein of a pit-mounted utility meter (i.e., water meter) 12 and a pit-mounted AMR system 14. The pit 10 is constructed generally of an enclosure 16 and a cover 18 that collectively define a volume within which the meter 12 and AMR system 14 may be positioned. As shown in FIG. 1, the cover 18 of pit is generally at ground level, identified at 20. The meter 12 is positioned in a lower portion of enclosure 16 and is connected to a water line 22 to measure and monitor a water usage therethrough. The AMR system 14 is positioned above meter 12 and adjacent the cover 18 of the pit 10, with a cover adaptor 24 and optional extender 25 of the AMR system 14 positioning an AMR device 26 of the AMR system 14 and providing for mounting of the system adjacent the cover 18. The AMR device 26 of system 14 is operatively connected to the meter 12 via a data cable 28 (i.e., "meter connection"), such that consumption data is provided to the AMR device 26 for subsequent transmission to a remote utility endpoint (not shown), with the data cable 28 being sufficiently long so as to allow the pit cover 18 to be removed with the AMR system 14 still mounted thereto to perform maintenance on the AMR device 26 and/or meter 12.

Figure 2:
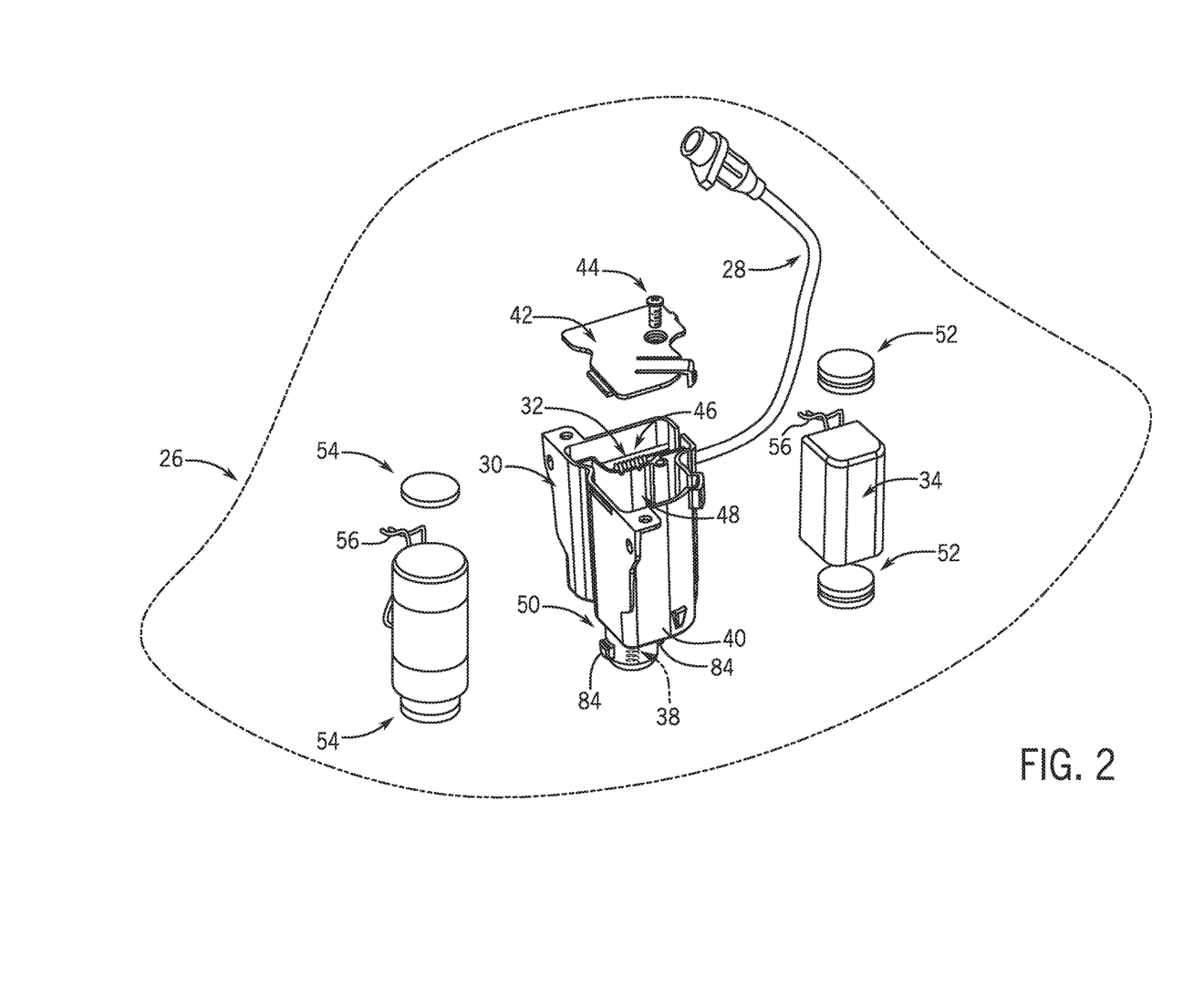
FIG. 2 is an exploded view of an AMR device included in the AMR system of FIG. 1, according to an embodiment of the invention.
Figure 3:
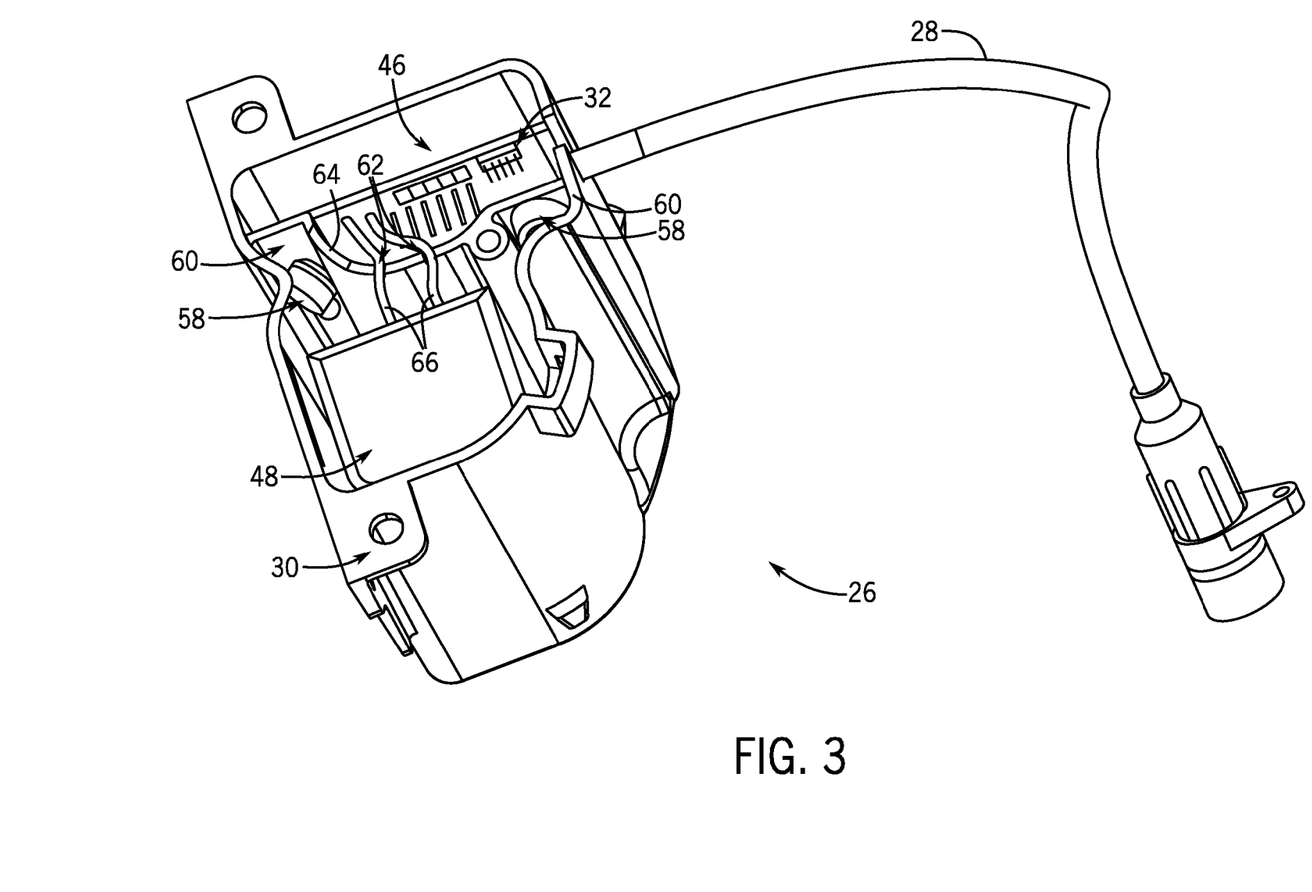
FIG. 3 is a perspective view of the AMR device of FIG. 2.
Figure 4:
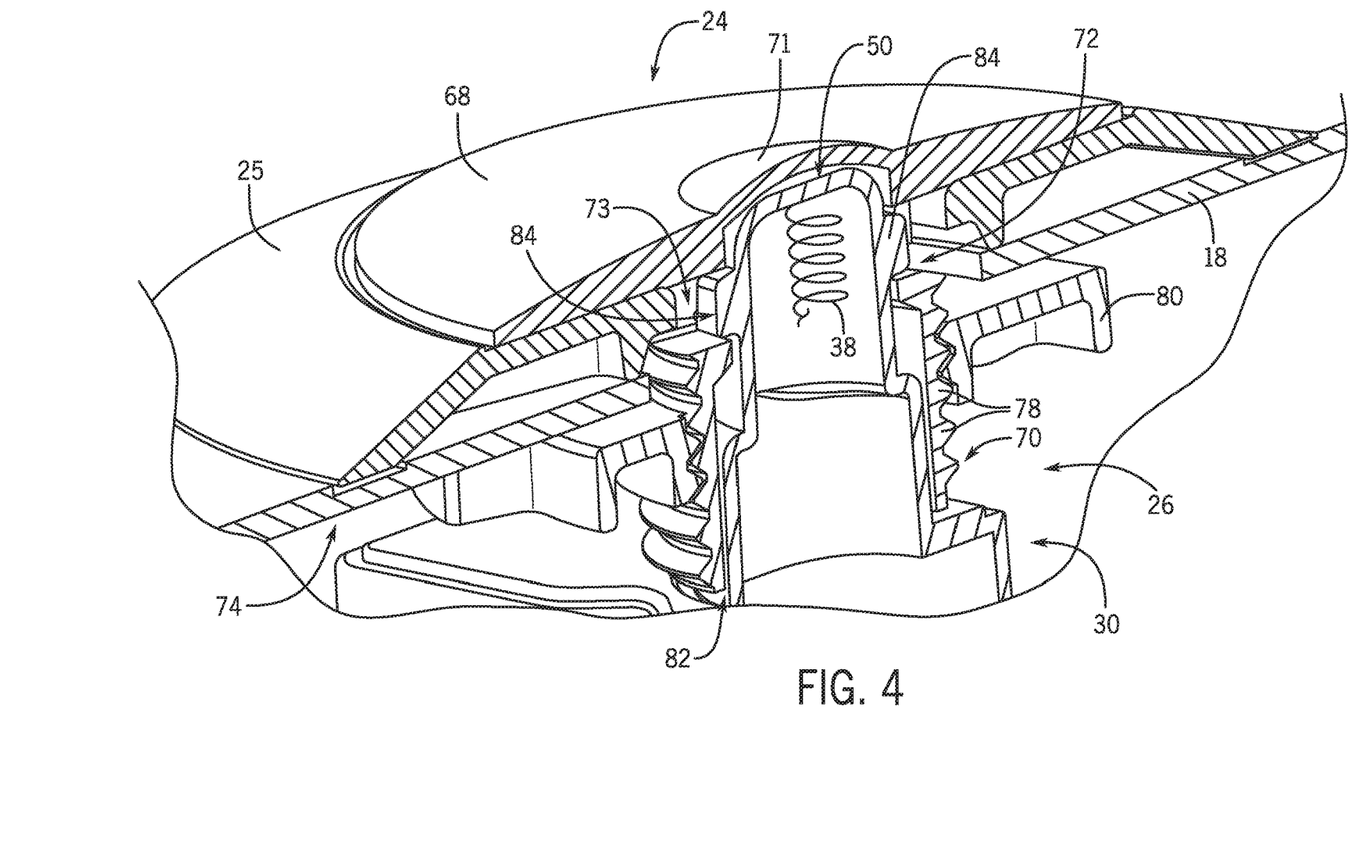
FIG. 4 is a cross-sectioned view of the cover adaptor, the extender, and the AMR device of FIG. 2 shown positioned in the utility-meter pit environment of FIG. 1, according to an embodiment of the invention.

A detailed view of the AMR device 26 is illustrated in FIGS. 2, 3 and 4, according to an exemplary embodiment. As shown in FIGS. 2 and 3, the AMR device 26 includes an outer enclosure 30 within which processing electronics 32 (e.g., a printed circuit board), a battery 34, 36, and a transmission device (i.e., antenna) 38 (see FIG. 4) are housed. The enclosure 30 is formed of a body 40 and cover 42 that define a volume in which the processing electronics 32, battery 34, 36, and transmission device 38 are positioned, with a fastening device 44 provided to secure the cover 42 to the body 40. The body 40 is constructed such that the volume of the enclosure 30 is generally divided into a series of compartments 46, 48, 50 for housing the processing electronics 32, battery 34, 36, and antenna 38—with these compartments referred to hereafter as an electronics compartment 46, battery compartment 48 and antenna compartment 50.

As shown in FIG. 2, the cover 42 of enclosure 30 is secured to body 40 via a fastener device 44 such that the cover 42 may be selectively removed from body 40 as desired by a technician. In an exemplary embodiment, fastener device 44 is in the form of a screw; however, it is recognized that other or additional suitable fastener devices could instead be used, such as a flexible clip or movable latch, for example. Removal of the fastener device 44 and cover 42 from body 40 provides access to the electronics compartment 46 and battery compartment 48 within enclosure such that, for example, data cable 28 may be connected to processing electronics 32 and a battery 34, 36 may be provided/replaced in the AMR device 26 as necessary during operation thereof.

According to an exemplary embodiment, battery compartment 48 is constructed to accommodate batteries of different sizes and capacities therein, such that an ideal battery (i.e., one that extends/maximizes the AMR device operating life and/or enables operation of the AMR device in different modes) can be used in AMR device 26 as determined by the installed network and application and battery power consumption associated therewith. Batteries of different types—generally referred to hereafter as a "small battery" and "large battery"—that may be accommodated in battery compartment 48 are illustrated in FIG. 2. In an embodiment where small battery 34 is to be utilized in AMR device 26, a first set of cushioning pads 52 are used to secure the battery 34 inside the battery compartment 48, while in an embodiment where large battery 36 is to be utilized in AMR device 26, a second set of cushioning pads 54 are used to secure the battery 36 inside the battery compartment 48. The first and second sets of cushioning pads 52, 54 are formed to have different thicknesses based on the size of their accompanying battery—with the first set of cushioning pads 52 utilized with small battery 34 having a greater thickness than the second set of cushioning pads 54 utilized with large battery 36. A common overall height/length of a battery 34, 36 and its associated set of cushioning pads 52, 54 may thus be achieved, with the overall height/length of the small battery 34 and its first set of cushioning pads 52 being equal to the overall height/length of the large battery 36 and its second set of cushioning pads 54—such that each of the batteries may be accommodated in battery compartment 48 in a robust and shock resistant manner.

Referring still to FIG. 2, it is seen that the processing electronics 32 of the AMR device 26 are encapsulated in electronics compartment 46 in order to protect the electronics from moisture present in the pit environment. Leads 56 from the battery 34, 36 are connected and encapsulated with the electronics 32 within electronics compartment 46 (i.e., an end of leads connected to processing electronics), and the end of the data cable 28 connectable to processing electronics 32 is also encapsulated within electronics compartment 46—with the data cable 28 transferring data from the meter 12 to the electronics 32 either electrically or optically.

Additional features are incorporated into AMR device 26 that facilitate replacement of the battery 34, 36 therein. As shown in FIG. 3, in an exemplary embodiment, moisture resistant crimp connectors 58, wire storage slots 60, and wire routing channels 62 are formed on/in the enclosure 30 to simplify and assist replacement of the battery 34, 36. The moisture resistant crimp connectors 58 provide for power to be restored to the electronics 32 upon replacement of battery 34, 36 via simplifying connection of power input wires 66 and output wires 56 thereto (e.g. wire splicing, etc.). The wire slots 60 are provided as channels formed within the battery compartment 48 and enable positioning/storage of excess wiring therein, as well as positioning of the crimp connectors 58 therein to provide for easy access thereto. The wire routing channels 62 are formed within a wall 64 of enclosure 30 that separates the battery compartment 48 and the electronics compartment 46 and capture wires 66 therein, so as to hold the wires 66 in a safe location and allow the cover 42 to be reattached upon replacement of the battery 34, 36. Accordingly, the moisture resistant crimp connectors 58, wire storage slots 60, and wire routing channels 62 within the enclosure 30 assist the replacement procedure for battery 34, 36.

The cushioning pads 52, 54, moisture resistant crimp connectors 58, wire storage slots 60, and wire routing channels 62 may thus collectively provide what is termed here as a "battery and wiring management system" that enables multiple battery form factors to be utilized in the AMR device 26 and allows for easy removal of the battery 34, 36. The cushioning pads 52, 54 allow for the use of different size batteries that enable the AMR device 26 to operate without maintenance for various periods and/or in different operating modes, while the moisture resistant crimp connectors 58, wire storage slots 60, and wire routing channels 62 assist a battery replacement procedure by ensuring that the connectors are properly positioned and wire service loops are stored correctly.

According to an exemplary embodiment, and as best shown in FIGS. 2 and 4, the antenna compartment 50 of AMR device 26 is constructed such that it extends outwardly from the battery compartment 48 and the electronics compartment 46 of the enclosure 30, with the antenna compartment 50 thus protruding out past the other compartments. As shown in FIG. 4, an end of the antenna compartment 50 opposite the battery compartment 48 and the electronics compartment 46 has a convex dome shape and is sized so as to accommodate positioning of the antenna 38 therein, with the antenna 38 enabling the AMR device 26 to communicate with a utility endpoint—i.e., as a transceiver providing two-way communication or as a one-way transmitter—with consumption data (obtained from meter 12, FIG. 1) being provided to the utility endpoint via the transmission of RF signals thereto. The dome shape of antenna compartment 50 enables positioning of the antenna 38 as close as possible to the far end of the enclosure 30. Wiring (not shown) connecting the antenna 38 to the battery 34, 36 and/or processing electronics 32 may also be accommodated by and routed through antenna compartment 50 as required for operation of the AMR device 26.

Referring back now to FIG. 1, and with continued reference to FIG. 4, it is recognized that it is desirable to increase the communication range (i.e., the RF range) of the AMR device 26 to the extent that is practicable. In order to maximize the communication range, the antenna 38 of the AMR device 26 should be mounted as high within the pit 10 as possible, so as to improve its transmission performance. To provide such mounting of the AMR device 26, the cover adaptor 24 and optional extender 25 of the AMR system 14 position the AMR device 26 adjacent the cover 18 of the pit 10.

Figure 5:
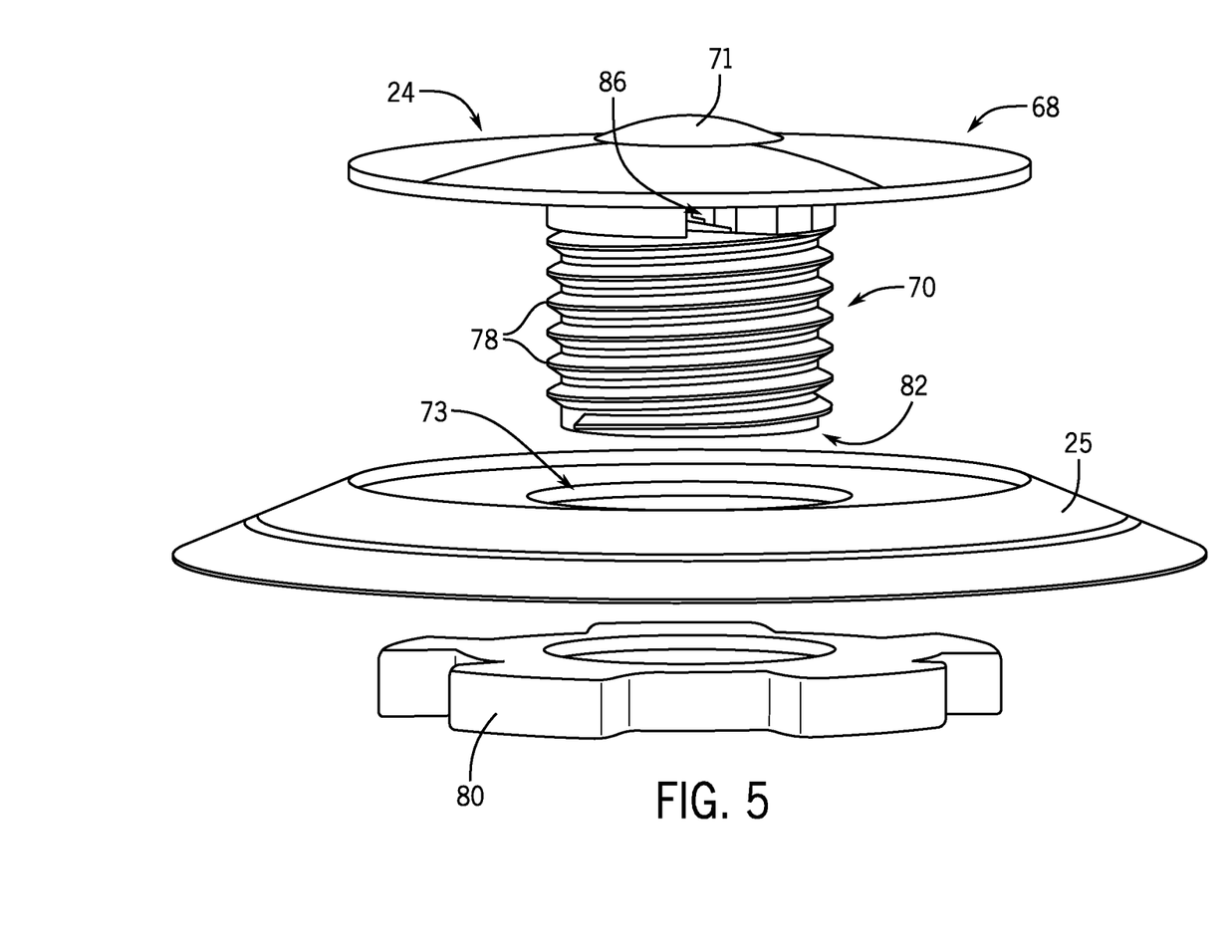
FIG. 5 is a perspective view of the cover adaptor and extender of FIG. 4.

An exemplary embodiment of the cover adaptor 24 and extender 25, and their positioning in relation to pit cover 18, is illustrated in FIGS. 4 and 5. As seen therein, the cover adaptor 24 generally includes a flanged end portion 68 from which a projection portion 70 protrudes outwardly therefrom. In one embodiment, a central area of flanged end portion 68 includes a raised dome 71 formed thereon that extends up further above the convex shaped top surface of flanged end portion 68—with the raised dome 71 positioned and configured to accommodate positioning of the dome-shaped end of antenna compartment 50 therein, as explained in greater detail below. The cover adaptor 24 is received in a hole 72 formed in pit cover 18—with the projection portion 70 of the cover adaptor 24 extending down through hole 72 in cover 18 and into pit. In one embodiment, the hole 72 in cover 18 is an industry standard 1¾" hole, with the projection portion 70 of cover adaptor 24 being sized according to fit snugly with the hole 72.

Extender 25 is constructed as a ring-shaped member that includes an opening 73 formed therein, so as to allow for placement of extender 25 about the projection portion 70 of cover adaptor. The extender 25 is positioned about projection portion 70 such that the extender 25 is placed between the cover adaptor 24 and pit cover 18—thereby spacing the cover adaptor 24 apart from pit cover 18 and allowing the cover adaptor 24 to protrude a greater distance upwardly from the pit cover. According to one embodiment, the extender 25 is fitted into a recessed area 74 formed in the pit cover 18 and is fitted therein such that the recessed area 74 hides an edge of the extender 25, with the extender 25 having a convex shaped top surface such that extender 25 slopes gently upward to extend slightly above the flat pit cover 18.

As seen in FIGS. 4 and 5, the projection portion 70 of cover adaptor 24 has a threaded outer surface 78 onto which an adaptor nut 80 may be screwed (once the projection portion 70 is positioned through the hole 72 of pit cover 18) in order to secure the cover adaptor 24 in place on the pit cover 18. The projection portion 70 of cover adaptor 24 also includes a hollow interior 82 formed therein that is open on the end of the projection portion 70 that is distal from flanged end portion 68. The hollow-interior 82 is thus open and able to receive the convex/dome shaped end of antenna compartment 50 therein, with the hollow interior 82 being sized to form a snug fit with the antenna compartment 50. As can be seen in FIG. 4, the projection portion 70 of cover adaptor 24 has a generally equal length as that of the antenna compartment 50, such that the cover adaptor 24 buts up against the ARM enclosure 30 (i.e., top surface of antenna dome 50) of the AMR device 26. The AMR device 26 is secured to the cover adaptor 24 by way of protrusions or bumps 84 formed on an outer surface of antenna compartment 50 (e.g., two protrusions 84 on opposing sides of the antenna compartment 50), with the protrusions 84 mating with grooves or tracks 86 formed on the interior of the projection portion 70 via a twist-lock type mating that allows for easy separation of the ARM device 26 from the cover adaptor 24 and simplifies battery replacement.

As can be seen in FIG. 4, the structure of cover adaptor 24—with its mating with extender 25 and its hollow interior 82 and raised dome 71 of projection portion 70 shaped to receive the convex/dome shaped end of antenna compartment 50 therein—thus provides for mounting of the AMR device 26 at an elevated position in/on the utility pit 10. The positioning of the convex/dome shaped end of antenna compartment 50 within the hollow interior 82 and up into raised dome 76 allows the antenna 38 of AMR device 26 to be elevated to a position that is essentially flush with (or extends slightly above) the top surface of the pit cover 18, thereby positioning the antenna 38 such that the RF communication range of the AMR device 26 is maximized.

Beneficially, embodiments of the invention thus provide a pit mounted AMR enclosure that allows multiple battery form factors within the AMR device and allows for easy removal of the batteries. Different size batteries allow the AMR device to operate without maintenance for various periods and/or in different operating modes. The enclosure allows moisture resistant crimp connectors and wire routing features within the enclosure, which assists the battery replacement procedure by ensuring that the connectors are properly positioned and wire service loops are stored correctly. The enclosure also supports the processing electronics and battery and is suitable as an endpoint or node-in-mesh configuration. Furthermore, the enclosure's design—when combined with its pit mount cover adaptor—moves the antenna to a higher position for increased communication (transmit and receive) range, with a convex cavity within the enclosure interacting with a concave cavity of the pit mount adaptor to move the antenna upward. When the enclosure is installed in the adaptor, the antenna is elevated to its maximum height and hence its transmitting and receiving range is increased.

Therefore, according to an embodiment of the invention, an AMR system adapted to be mounted in a utility meter pit includes an AMR device having a meter connection configured to provide consumption data from a utility meter in the utility meter pit, processing electronics configured to receive the consumption data via the meter connection and convert the consumption data into a transmittable signal, an antenna configured to wirelessly transmit the transmittable signal to a remote device, and an enclosure that houses the processing electronics and the antenna therein to provide protection thereto from ambient conditions in the utility meter pit. The enclosure defines a dome-shaped antenna compartment therein configured to house the antenna, the antenna compartment protruding out from a remainder of the enclosure so as to provide for positioning of the antenna at a location extended out therefrom.

According to another embodiment of the invention, an AMR system adapted to be mounted in a utility meter pit comprises an AMR device including processing electronics configured to receive consumption data from a utility meter located in the utility meter pit and convert the consumption data into a transmittable signal, an antenna configured to wirelessly transmit the transmittable signal to a remote device, and an enclosure comprising an enclosure body and enclosure cover that collectively define an interior volume that accommodates the processing electronics and the antenna therein. The enclosure body is constructed to define an electronics compartment configured to house the processing electronics therein, an antenna compartment configured to house the antenna therein, and a battery compartment configured to house a battery therein used to power the processing electronics and the antenna. The AMR device also includes a battery and wiring management system configured to secure a battery in place within the battery compartment and manage a positioning and connection of wiring within the enclosure, so as to enable multiple battery form factors in the AMR device and provide for easy replacement of the battery.

According to yet another embodiment of the invention, a method is provided for mounting an AMR device in a utility meter pit having an enclosure and a cover that collectively define a volume within which a utility meter and the AMR device may be positioned. The method includes positioning a cover adaptor onto the cover of the utility meter pit, wherein positioning the cover adaptor comprises translating a projection portion of the cover adaptor through a hole formed in the cover of the utility meter pit, the projection portion comprising a generally hollow interior and mating a flanged end portion of the cover adaptor with the cover of the utility meter pit, the flanged end portion formed on one end of the projection portion. The method also includes inserting a dome-shaped projection of an enclosure of the AMR device into the hollow interior of the projection portion of the cover adaptor to secure the AMR device to the cover adaptor, wherein the dome-shaped projection of the AMR device enclosure mates with the hollow interior of the projection portion to mount an antenna of the AMR device at a height generally flush with a top surface of the cover of the utility meter pit.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An automatic meter reading (AMR) system adapted to be mounted in a utility meter pit, the AMR system comprising:
    an AMR device including:
        a meter connection configured to provide consumption data from a utility meter in the utility meter pit;
        processing electronics configured to receive the consumption data via the meter connection and convert the consumption data into a transmittable signal;
        an antenna configured to wirelessly transmit the transmittable signal to a remote device; and
        an enclosure that houses the processing electronics and the antenna therein to provide protection thereto from ambient conditions in the utility meter pit;
        wherein the enclosure defines a dome-shaped antenna compartment therein configured to house the antenna, the antenna compartment protruding out from a remainder of the enclosure so as to provide for positioning of the antenna at a location extended out therefrom; and
    a cover adaptor mateable with the AMR device and with a cover of the utility meter pit, the cover adaptor comprising:
        a flanged end portion; and
        a projection portion protruding outwardly from the flanged end portion, the projection portion comprising a hollow interior formed therein that is open on an end of the projection portion that is distal from the flanged end portion;

wherein the projection portion is sized and constructed to so as to be positionable through a hole formed in the cover of the utility meter pit and so as to receive and secure the dome-shaped antenna compartment of the AMR device enclosure in the hollow interior thereof;

wherein the positioning of the projection portion of the cover adaptor through the hole in the cover of the utility meter pit and the securing of the dome-shaped antenna compartment of the AMR device enclosure in the hollow interior of the projection portion mounts the antenna of the AMR device at a height approximately flush with a top surface of the cover of the utility meter pit; and wherein the dome-shaped antenna compartment comprises protrusions formed on an outer surface thereof and the projection portion comprises grooves formed thereon, with the protrusions mating with the grooves via a twist-lock type mating, so as to provide for selective mating and separation of the AMR device from the cover adaptor.

2. The AMR system of claim 1 wherein the enclosure comprises:
an enclosure body generally defining an interior volume to house the processing electronics and the antenna therein; and
an enclosure cover mateable with the enclosure body and selectively removable therefrom to expose the interior volume of the enclosure body.

3. The AMR system of claim 2 wherein the enclosure body is constructed to generally define the antenna compartment, as well as a battery compartment and an electronics compartment therein, with the electronics compartment configured to house the processing electronics therein and the battery compartment configured to house a battery of the AMR device therein.

4. The AMR system of claim 3 wherein the AMR device further comprises a pair of battery cushioning pads positionable on opposing ends of the battery to secure the battery in place within the battery compartment, the pair of battery cushioning pads comprising one of:
a first pair of battery cushioning pads having a first thickness and useable with a first battery size; and
a second pair of battery cushioning pads having a second thickness and useable with a second battery size;
wherein the first thickness of the first pair of battery cushioning pads is greater than the second thickness of the second pair of battery cushioning pads; and
wherein an overall height of the first pair of battery cushioning pads and a battery having the first battery size is equal to an overall height of the second pair of battery cushioning pads and a battery having the second battery size.

5. The AMR system of claim 3 wherein the battery compartment includes wire storage channels formed therein to house wiring in the AMR device.

6. The AMR system of claim 5 wherein the AMR device further comprises a plurality of moisture resistant crimp connectors positioned within the wire storage channels of the battery compartment to enable power to be provided to the AMR device upon battery replacement.

7. The AMR system of claim 3 wherein the enclosure further comprises wire routing channels formed in a wall separating the battery compartment and the electronics compartment, the wire routing channels configured to capture wiring in the AMR device, so as to enable securing of the enclosure cover to the enclosure body.

8. The AMR system of claim 1 further comprising a ring-shaped extender constructed to be positionable about the projection portion of the cover adaptor, the ring-shaped extender being positioned between the cover adaptor and the cover of the utility meter pit so as to space the cover adaptor apart from the cover and cause the cover adaptor to protrude upwardly from the top surface of the cover.

9. The AMR system of claim 1 wherein the projection portion of the cover adaptor comprises a threaded outer surface; and
wherein the cover adaptor further comprises an adaptor nut configured to engage the threaded outer surface of the projection portion, so as to secure the cover adaptor to the cover of the utility meter pit.

10. A method for mounting an automatic meter reading (AMR) device in a utility meter pit having an enclosure and a cover that collectively define a volume within which a utility meter and the AMR device may be positioned, the method comprising:
positioning a cover adaptor onto the cover of the utility meter pit, wherein positioning the cover adaptor comprises:
translating a projection portion of the cover adaptor through a hole formed in the cover of the utility meter pit, the projection portion comprising a generally hollow interior; and
mating a flanged end portion of the cover adaptor with the cover of the utility meter pit, the flanged end portion formed on one end of the projection portion; and
inserting a dome-shaped projection of an enclosure of the AMR device into the hollow interior of the projection portion of the cover adaptor to secure the AMR device to the cover adaptor;
wherein the dome-shaped projection of the AMR device enclosure mates with the hollow interior of the projection portion via a twist-lock type mating to mount an antenna of the AMR device at a height generally flush with a top surface of the cover of the utility meter pit; and
wherein the dome-shaped projection of the AMR device enclosure comprises protrusions formed on an outer surface thereof and the projection portion comprises grooves formed thereon, with the protrusions mating with the grooves via the twist-lock type mating, so as to provide for selective mating and separation of the AMR device from the cover adaptor.

11. The method of claim 10 further comprising:
positioning a ring-shaped extender about the projection portion of the cover adaptor and between the cover adaptor and the cover of the utility meter pit, so as to space the cover adaptor apart from the cover and cause the cover adaptor to protrude upwardly from the top surface of the cover; and
engaging an adaptor nut with a threaded outer surface of the projection portion of the cover adaptor, so as to secure the cover adaptor to the cover of the utility meter pit.

12. The method of claim 10 wherein inserting the dome-shaped projection of the enclosure of the AMR device into the hollow interior of the projection portion of the cover adaptor further comprises:
inserting the dome-shaped projection of the enclosure of the AMR device into the hollow interior of the projection portion of the cover adaptor and up into a raised dome formed on the flanged end portion of the cover adaptor; and mating one or more protrusions formed on the dome-shaped projection of the enclosure of the AMR device with a groove formed in the hollow interior of the projection portion of the cover adaptor to secure the AMR device to the cover adaptor.

* * * * *